US007763309B2

(12) United States Patent
Kato

(10) Patent No.: US 7,763,309 B2
(45) Date of Patent: Jul. 27, 2010

(54) METHOD OF CONTROLLING CHEMICAL SOLUTION APPLYING APPARATUS, CHEMICAL SOLUTION APPLYING APPARATUS, AND METHOD OF MANUFACTURING SEMICONDUCTOR DEVICE

(75) Inventor: Hirokazu Kato, Zushi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 965 days.

(21) Appl. No.: 11/543,081

(22) Filed: Oct. 5, 2006

(65) Prior Publication Data

US 2007/0082122 A1 Apr. 12, 2007

(30) Foreign Application Priority Data

Oct. 6, 2005 (JP) ............................. 2005-293962

(51) Int. Cl.
*B05D 3/00* (2006.01)
(52) U.S. Cl. ..................... 427/8; 427/240; 118/663; 118/708; 118/52; 438/782

(58) Field of Classification Search .................. 427/8, 427/240; 118/663, 708, 52; 438/782
See application file for complete search history.

(56) References Cited

U.S. PATENT DOCUMENTS

2005/0095537 A1* 5/2005 Wu et al. .................... 430/302

FOREIGN PATENT DOCUMENTS

| JP | 2-241025 | 9/1990 |
| JP | 9-320958 | 12/1997 |
| JP | 2003-266006 | 9/2003 |

* cited by examiner

*Primary Examiner*—Kirsten C Jolley
(74) *Attorney, Agent, or Firm*—Finnegan, Henderson, Farabow, Garrett & Dunner, L.L.P.

(57) ABSTRACT

A method for controlling a chemical solution applying apparatus is disclosed. The method includes setting at least two dummy dispense rates for dummy dispensation which is periodically carried out by the chemical solution applying apparatus, and switching the dummy dispense rates so that the amount of chemical solution dispensed during a first predetermined period is kept over a predetermined value.

20 Claims, 3 Drawing Sheets

METHOD OF CONTROLLING CHEMICAL SOLUTION APPLYING APPARATUS, CHEMICAL SOLUTION APPLYING APPARATUS, AND METHOD OF MANUFACTURING SEMICONDUCTOR DEVICE

CROSS-REFERENCE TO RELATED APPLICATIONS

This application is based upon and claims the benefit of priority from prior Japanese Patent Application No. 2005-293962, filed Oct. 6, 2005, the entire contents of which are incorporated herein by reference.

BACKGROUND OF THE INVENTION

1. Field of the Invention

The present invention relates to a method of controlling a chemical solution applying apparatus, a chemical solution applying apparatus, and a method of manufacturing a semiconductor device, and in particular, to a method of controlling a chemical solution applying apparatus that applies a chemical solution such as resist to a substrate such as a semiconductor wafer, the method being used for a process of manufacturing, for example, a semiconductor device, a flat display panel (FPD), or a micro-electronics micro-system (MEMS).

2. Description of the Related Art

In recent years, the manufacture of semiconductor devices has needed to adjust to low-volume high-mix production. In the low-volume batch production, the amount of chemical solutions used varies significantly among the types of semiconductor devices, however, the process does not require so much amount of chemical solutions. Thus, chemical solutions staying in piping may be degraded and fail to exhibit desired performance.

Under these circumstances, Jpn. Pat. Appln. KOKAI Publication No. 2003-266006 discloses a technique for a chemical solution applying apparatus having a control section that functions to discharge resist (i.e., chemical solution) that has stayed in piping for a predetermined time period, on the basis of the characteristics of resist. However, if the quality preservation period of the chemical solution is short and only a small amount of the chemical solution is infrequently used during manufacture, a large amount of chemical solution is uselessly discharged every time the predetermined time elapses. The amount of chemical solution uselessly discharged may reach several hundred cubic centimeters. Further, a pump for a dispenser system is normally optimized for small-amount dispensations. Consequently, discharging a large amount of chemical solution requires a very long time, that is, several tens of minutes. The discharge process must be completed before a new chemical solution can be dispensed and applied to substrates. Thus, a large amount of chemical solution discharged disadvantageously results in the need for a long time for a process of applying the chemical solution to substrates.

To solve this problem, it is possible to increase the frequency or amount of dummy chemical solution dispensation (i.e., chemical dispensation for discharge, that is, chemical solution dispensation carried out while no lots (semiconductor substrates) are processed) that is set so as to prevent the chemical solution from being solidified at the tip of a nozzle; this prevents a degraded chemical solution from being dispensed to substrates. However, this method frequently carries out dummy dispensations even during the frequent processing of lots. As a result, the method disadvantageously fails to reduce the amount of useless chemical solutions.

BRIEF SUMMARY OF THE INVENTION

According to an aspect of the present invention, there is provided a method for controlling a chemical solution applying apparatus, the method comprising setting at least two dummy dispense rates for dummy dispensation which is periodically carried out by the chemical solution applying apparatus, and switching the dummy dispense rates so that the amount of chemical solution dispensed during a first predetermined period is kept over a predetermined value.

According to another aspect of the present invention, there is provided a chemical solution applying apparatus comprising:

a chemical solution storage container which stores a chemical solution and which is kept in a refrigerated condition;

a pipe which is used as a conduit through which the chemical solution is fed from the chemical solution storage container to a chemical solution applying dispense nozzle and which is disposed in a room temperature environment;

a control pump for chemical solution supply which is inserted in a middle of the pipe; and a controller which performs control using a method for controlling a chemical solution applying apparatus, the method comprising setting at least two dummy dispense rates for dummy dispensation which is periodically carried out by the chemical solution applying apparatus, and switching the dummy dispense rates so that the amount of chemical solution dispensed during a first predetermined period is kept over a predetermined value.

According to a further aspect of the present invention, there is provided a method for manufacturing a semiconductor device, the method using, for a process of manufacturing a semiconductor device, a method for controlling a chemical solution applying apparatus, the method comprising setting at least two dummy dispense rates for dummy dispensation which is periodically carried out by the chemical solution applying apparatus, and switching the dummy dispense rates so that the amount of chemical solution dispensed during a first predetermined period is kept over a predetermined value.

DETAILED DESCRIPTION OF THE INVENTION

Figure 1:
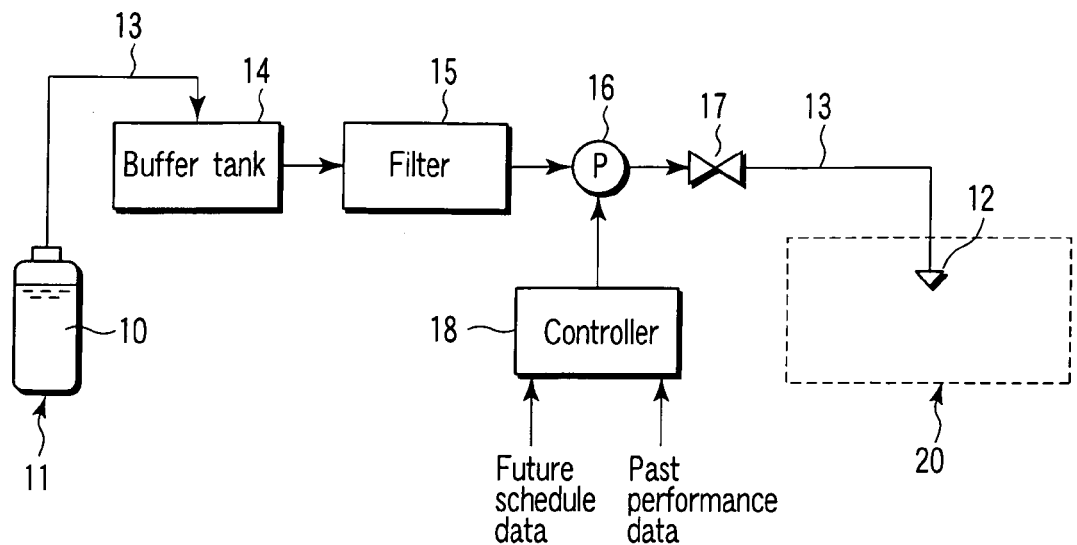
FIG. 1 is a diagram showing the configuration of a chemical solution applying apparatus according to a first embodiment of the present invention.

An embodiment of the present invention will be described below with reference to the drawings. In the description, components common to all of the drawings are denoted by common reference numerals.

FIG. 1 shows the exemplary configuration of a chemical solution applying apparatus according to an embodiment of the present invention. In the description of the present embodiment, a silicon oxide ($SiO_2$) film is formed using a spin on glass (SOG) chemical solution (for example, resist).

In the chemical solution applying apparatus shown in FIG. 1, a chemical solution container in which an SOG solution 10 is stored, for example, a chemical solution bottle, is kept in a refrigerated condition by appropriate means. A pipe 13 is used as a chemical solution supply conduit from the chemical solution bottle 11 to a chemical solution dispensing nozzle 12 in a chemical solution application processing chamber 20. The pipe 13 is disposed in a room temperature environment. A buffer tank 14, a filter 15, a pump 16, a pressure operated valve 17, and the like are inserted in the middle of the pipe 11. A chemical solution is temporarily retained in the buffer tank 14, the filter 15 filters the chemical solution, the pump 16 controls the amount of chemical solution supplied, and the pressure-operated valve 17 adjusts the flow of the chemical solution. As described later for a method of controlling an SOG solution applying apparatus, past performance data (past log) and/or future schedule data on chemical solution dispensations are input to a controller 18 using a microcomputer or the like. The controller 18 generates control signals according to predetermined control rules to control the pump 16 and the like.

Now, description will be given of an example of a chemical solution applying apparatus controlling method that is carried out, in which the chemical solution applying apparatus shown in FIG. 1 is used. The chemical solution used is an SOG solution. First, the chemical solution applying apparatus sets two dummy dispense rates (1) and (2). The dummy dispense rate (1) is determined so as to prevent solidification of the SOG solution at the tip of the nozzle, and is 0.5 cc/once/hour. The dummy dispense rate (2) is determined so as to prevent dispensation of a degraded SOG solution during application of the SOG solution to a substrate, and is 3 cc/once/hour.

The dummy dispense rate (2) will be described below in detail. Since the chemical solution bottle 11 is refrigerated, the quality preservation period of the chemical solution (in the present embodiment, the SOG solution) 10 is almost indefinite. On the other hand, the quality preservation period of the SOG solution 10 in the pipe 13 (at room temperature) from the chemical solution bottle 11 to the dispensing nozzle 12 is, for example, 144 hours. Further, the capacity of the pipe from the chemical solution bottle 11 to the dispensing nozzle 12 is, for example, 216 cc. Under these conditions, at dummy dispense timings, dummy dispense amount is switched according to a control rule 1 in a flowchart shown in FIG. 2.

Figure 2:
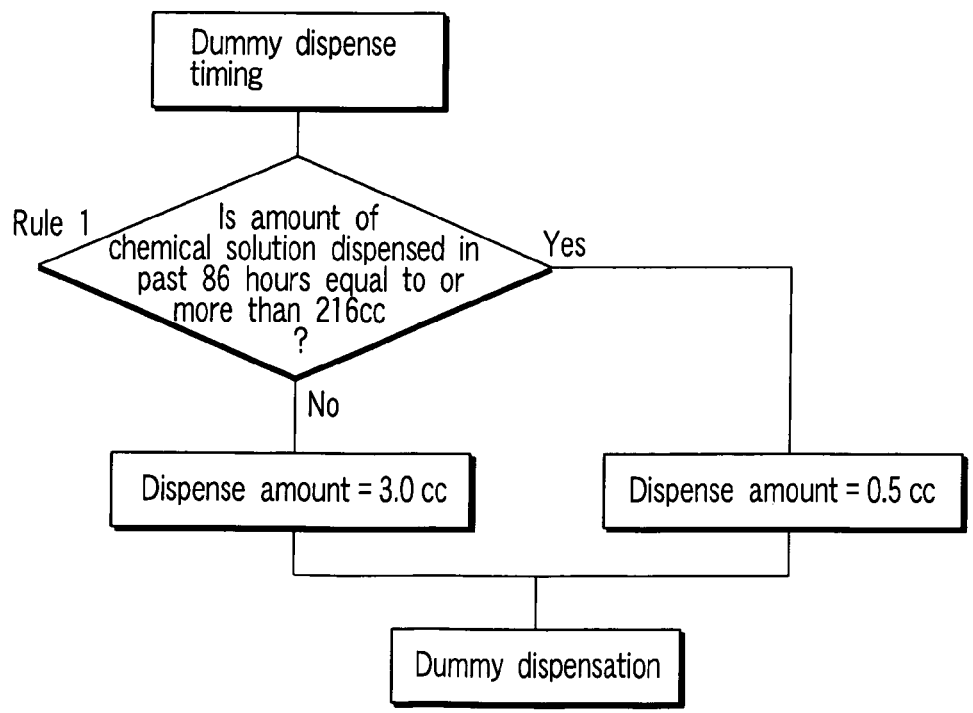
FIG. 2 is a flowchart showing a control rule 1 according to which dummy dispense amount is switched, in which the chemical solution applying apparatus in FIG. 1 is used.

The flowchart in FIG. 2 shows how the dummy dispense amount is switched, in which the control rule 1 is applied.

At a dummy dispense timing, according to the control rule 1, 0.5 cc of SOG solution is dispensed which corresponds to the minimum amount required to prevent the SOG solution from being solidified at the tip of the nozzle 12, under the following condition: the total amount of SOG solution dispensed within the past 86 hours, that is, the amount of SOG solution dispensed within the past 86 hours for application to the substrate plus the amount of SOG solution dispensed within the past 86 hours as dummy dispense, is equal to or more than the capacity of the pipe from the chemical solution bottle 11 to the dispensing nozzle 12, that is, 216 cc or more.

On the other hand, if the total amount of SOG solution dispensed within the past 86 hours is less than 216 cc, 3 cc of SOG solution is dispensed at the dummy dispense timing. This allows at least 216 cc of SOG solution to be dispensed within continuous 86 hours.

Figure 3:
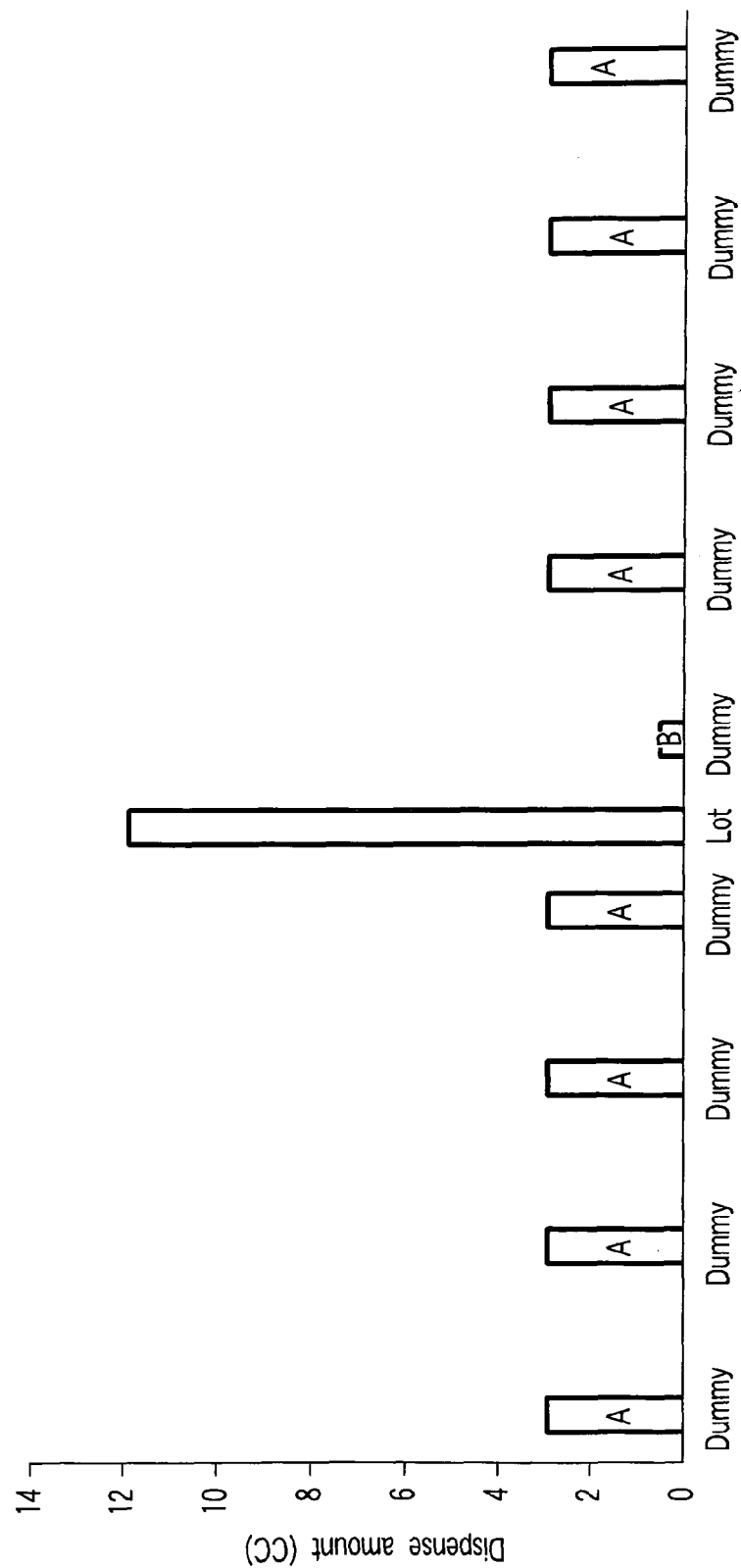
FIG. 3 is a diagram showing an example of distribution of the amount of SOG solution dispensed according to the control rule 1 shown in FIG. 2.

FIG. 3 shows an example of distribution of the amount of SOG solution dispensed according to the control rule 1. As shown in FIG. 3, a dummy dispensing operation A of dispensing 3 cc of SOG solution every hour is performed, for example, 72 times. Then, 12 cc of SOG solution is dispensed for application to the substrate (shown as a "Lot" in FIG. 3). Subsequently, at a dummy dispense timing, a dummy dispensing operation B is performed, as shown in FIG. 3, in which 0.5 cc of SOG solution is dispensed which corresponds to the minimum amount required to prevent the SOG solution from being solidified at the nozzle tip.

On the other hand, if the total amount of SOG solution dispensed within the past 86 hours is less than 216 cc, 3 cc of SOG solution is dispensed at the dummy dispense timing. This allows at least 216 cc of SOG solution to be dispensed within continuous 86 hours.

Here, the "past 86 hours" is calculated and determined on the basis of at least one of the degradation level of the SOG solution in connection with the passage of time, the capacity of the SOG solution bottle, and the capacity of SOG solution in the pipe in the SOG applying apparatus, so that the SOG solution degraded owing to the expiration of the quality preservation period is prevented from being dispensed onto the semiconductor substrate, regardless of the processing frequency of the substrate (frequency of applications to the substrate).

The control rule 1 is applied to switch the dummy dispense amount. This enables the amount of uselessly dispensed SOG solution to be minimized while preventing the solidification of the SOG solution at the nozzle tip and the dispensation of a degraded SOG solution onto the semiconductor substrate.

An SOG film thus formed on the semiconductor substrate is used as a mask when oxidizing the semiconductor substrate (silicon substrate) to form a silicon oxide ($SiO_2$) film on the semiconductor substrate.

Figure 4:
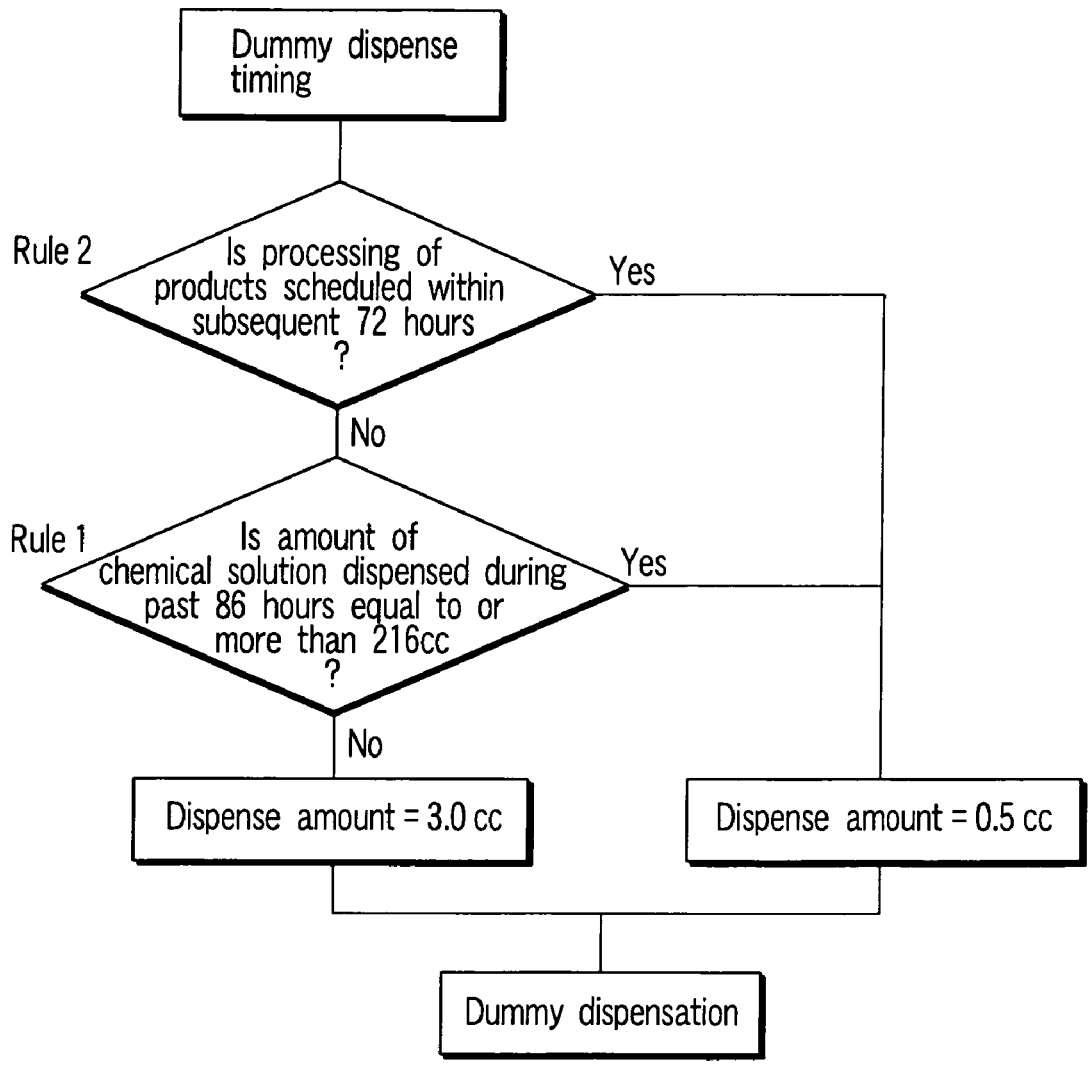
FIG. 4 is a flowchart showing control rules 1 and 2 according to which the dummy dispense amount is switched, in which the chemical solution applying apparatus in FIG. 1 is used.

FIG. 4 is another flowchart showing how the dummy dispense amount is switched, in which control rules 1 and 2 are applied.

At a dummy dispense timing, if it is determined that no SOG solution is applied to the substrate within the subsequent 72 hours, then according to the control rule 2, 0.5 cc of SOG solution is dispensed which corresponds to the minimum amount required to prevent the SOG solution from being solidified at the nozzle tip.

On the other hand, at the dummy dispense timing, if it is determined that the SOG solution is scheduled to be applied to the substrate within the subsequent 72 hours, then according to the control rule 2, the above control rule 1 is applied. That is, 0.5 cc of SOG solution is dispensed which corresponds to the minimum amount required to prevent the SOG solution from being solidified at the nozzle tip if the total amount of SOG solution dispensed within the past 86 hours, that is, the amount of SOG solution dispensed within the past 86 hours for application to the substrate plus the amount of SOG solution dispensed within the past 86 hours for dummy dispense, is equal to or more than 216 cc. On the other hand, if the total amount of SOG solution dispensed within the past 86 hours is less than 216 cc, 3 cc of SOG solution is dispensed at the dummy dispense timing. This allows at least 216 cc of SOG solution to be dispensed within continuous 86 hours.

The above control rules 2 and 1 are applied to switch the dummy dispense amount. This enables the amount of uselessly dispensed SOG solution to be minimized while preventing the solidification of the SOG solution at the nozzle tip and the dispensation of a degraded SOG solution onto the semiconductor substrate.

An SOG film thus formed on the semiconductor substrate is used as a mask when oxidizing the semiconductor substrate (silicon substrate) to form a silicon oxide ($SiO_2$) film on the semiconductor substrate.

The dummy dispense rate is not limited to the above embodiment. It is only essential that the amount of chemical solution dispensed within a predetermined time period always exceeds a predetermined value. For example, in the above description, the dummy dispense rate (2) is 3 cc/once/hour, however, it may be changed to, for example, 0.5 cc/once/10 minutes. That is, the time interval of dispensations and the amount of chemical solution dispensed during each operation may be changed. Alternatively, the dummy dispense rate (2) may be changed to, for example, 1.5 cc/twice/hour. That is, the number of dispensations and the amount of chemical solution dispensed during each operation may be changed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for controlling a chemical solution applying apparatus, the method comprising setting at least two dummy dispense rates for dummy dispensation which is periodically carried out by the chemical solution applying apparatus, and switching the dummy dispense rates so that the amount of chemical solution dispensed during a first predetermined period is kept over a predetermined value.

2. The method for controlling a chemical solution applying apparatus according to claim 1, wherein the switching of the dummy dispense rates is determined on the basis of the amount of chemical solution dispensed in the past and/or the number of substrates scheduled to be processed.

3. The method for controlling a chemical solution applying apparatus according to claim 1, wherein the dummy dispense rates are determined to prevent solidification of the chemical solution at a chemical solution applying nozzle tip and dispensation of a degraded chemical solution onto a substrate.

4. The method for controlling a chemical solution applying apparatus according to claim 1, wherein the predetermined period is determined on the basis of at least one of degradation level of the chemical solution in connection with elapse of time, the capacity of a chemical solution bottle, and the capacity of chemical solution in a pipe in the chemical solution applying apparatus.

5. The method for controlling a chemical solution applying apparatus according to claim 1, wherein the chemical solution is a spin on glass.

6. The method for controlling a chemical solution applying apparatus according to claim 1, wherein the at least two dummy dispense rates include a first dummy dispense rate which is determined to prevent solidification of the chemical solution at the nozzle tip and a second dispense rate which is determined to prevent dispensation of a degraded chemical solution onto a substrate.

7. The method for controlling a chemical solution applying apparatus according to claim 6, wherein the first and second dummy dispense rates are switched so that if the amount of chemical solution dispensed during the first predetermined period in the past is equal to or more than the predetermined value, the first dummy dispense rate is applied, and if the amount of chemical solution dispensed during the first predetermined period in the past is less than the predetermined value, the second dummy dispense rate is applied.

8. The method for controlling a chemical solution applying apparatus according to claim 7, wherein the amount of chemical solution dispensed during each dispensation at the first dummy dispense rate is less than that dispensed during each dispensation at the second dummy dispense rate.

9. The method for controlling a chemical solution applying apparatus according to claim 7, wherein the chemical solution dispensed at the first dummy dispense rate and the chemical solution dispensed at the second dummy dispense rate are dispensed at a time.

10. The method for controlling a chemical solution applying apparatus according to claim 7, wherein the chemical solution dispensed at the second dummy dispense rate is dispensed in a plurality of divided amounts.

11. The method for controlling a chemical solution applying apparatus according to claim 7, wherein the chemical solution is a spin on glass.

12. The method for controlling a chemical solution applying apparatus according to claim 1, wherein the first and second dummy dispense rates are sequentially switched according to a first rule and a second rule so that according to the first rule, if it is determined that no chemical solution is applied to the substrate within a second predetermined period in the subsequence, the first dummy dispense rate is applied, and if it is determined that the chemical solution is applied to the substrate within the second predetermined period in the subsequence, the second rule is applied and so that according to the second rule, if the amount of chemical solution dispensed during the first predetermined period in the past is equal to or more than the predetermined value, the first dummy rate is applied, and if the amount of chemical solution dispensed during the first predetermined period in the past is less than the predetermined value, the second dummy rate is applied.

13. The method for controlling a chemical solution applying apparatus according to claim 12, wherein the amount of chemical solution dispensed during each dispensation at the first dummy dispense rate is less than that dispensed during each dispensation at the second dummy dispense rate.

14. The method for controlling a chemical solution applying apparatus according to claim 12, wherein the chemical solution dispensed at the first dummy dispense rate and the chemical solution dispensed at the second dummy dispense rate are dispensed at a time.

15. The method for controlling a chemical solution applying apparatus according to claim 12, wherein the chemical solution dispensed at the second dummy dispense rate is dispensed in a plurality of divided amounts.

16. The method for controlling a chemical solution applying apparatus according to claim 12, wherein the chemical solution is a spin on glass.

17. A method for manufacturing a semiconductor device, the method using, for a process of manufacturing a semiconductor device, a method for controlling a chemical solution applying apparatus, the method comprising setting at least two dummy dispense rates for dummy dispensation which is periodically carried out by the chemical solution applying apparatus, and switching the dummy dispense rates so that the amount of chemical solution dispensed during a first predetermined period is kept over a predetermined value.

18. The method for manufacturing a semiconductor device according to claim 17, wherein the switching of the dummy dispense rates is determined on the basis of the amount of chemical solution dispensed in the past and/or the number of substrates scheduled to be processed.

19. The method for manufacturing a semiconductor device according to claim 17, wherein the dummy dispense rates are determined to prevent solidification of the chemical solution at a chemical solution applying nozzle tip and dispensation of a degraded chemical solution onto a substrate.

20. The method for manufacturing a semiconductor device according to claim 17, wherein the predetermined period is determined on the basis of at least one of level of degradation of the chemical solution in connection with passage of time, the capacity of a chemical solution bottle, and the capacity of chemical solution in a pipe in the chemical solution applying apparatus.

* * * * *